(12) United States Patent
Watanabe et al.

(10) Patent No.: US 6,176,932 B1
(45) Date of Patent: Jan. 23, 2001

(54) THIN FILM DEPOSITION APPARATUS

(75) Inventors: Naoki Watanabe, Kodaira; Osamu Watabe, Fuchu; Hideki Hayashida, Tachikawa, all of (JP)

(73) Assignee: Anelva Corporation (JP)

( * ) Notice: Under 35 U.S.C. 154(b), the term of this patent shall be extended for 0 days.

(21) Appl. No.: 09/250,033

(22) Filed: Feb. 12, 1999

Related U.S. Application Data

(60) Provisional application No. 60/076,618, filed on Mar. 3, 1998.

(30) Foreign Application Priority Data

Feb. 16, 1998 (JP) .................................................. 10-050191

(51) Int. Cl.[7] .............................. C23C 16/00; H05H 1/00
(52) U.S. Cl. ............................................. 118/719; 156/345
(58) Field of Search ............................ 118/719; 156/345; 438/905; 134/1.1, 1.2

(56) References Cited

U.S. PATENT DOCUMENTS 4,816,113 * 3/1989 Yamazaki ............................ 156/345
5,505,779 * 4/1996 Mizuno et al. ...................... 118/719

* cited by examiner

Primary Examiner—Shrive Beck
Assistant Examiner—Parviz Hassanzadeh
(74) Attorney, Agent, or Firm—Coudert Brothers

(57) ABSTRACT

An apparatus for manufacturing information recording disks is disclosed. The apparatus includes a deposition chamber for providing an undercoat layer to a substrate to be treated, a deposition chamber for providing a magnetic recording layer on the substrate, a deposition chamber for providing a protective layer over the recording layer and a holding chamber for removing the resulting information recording disk upon completion of the process steps. The deposition chamber which provides the protective layer includes a system which selectively introduces heated plasma and oxygen into the interior of the deposition chamber to clean the interior surfaces of the chamber while the apparatus is in use. The heated plasma and oxygen interact with any excess protective layer material, resulting in the formation of a gas which is removed from the interior of the deposition chamber by a pumping system. The holding chamber is used to remove and maintain the processed information recording disk while the interior of the deposition chamber is being cleaned.

20 Claims, 12 Drawing Sheets

THIN FILM DEPOSITION APPARATUS

This application claims benefit to U.S. provisional application 60/076,618 filed Mar. 3, 1998.

FIELD OF THE INVENTION

The present invention is generally related to the manufacture of information recording disks and, more particularly, to the manufacture of protective films used to protect the recording layer of information recording disks.

BACKGROUND OF THE INVENTION

Information recording disks such as magnetic recording disks used, for example, in "hard disks," compact disks, etc. have a structure where a recording layer is formed on the surface of a substrate which is made of a metal or dielectric material. In one process for making a magnetic disk used in a hard disk, a substrate of aluminum (Al), or other suitable metal or dielectric material is first coated with a nickel-phosphorus (NiP) layer. Next, an undercoat metal film of suitable material (such as CoCrTa) is deposited on a surface of the substrate and then a recording layer made from a thin magnetic film of suitable material is deposited on the metal film layer. The recording disk is completed by the depositing of a protective layer over the recording layer.

The protective layer must be composed of a durable film which has lubricating properties in order to shield the recording layer from impact and harsh environments. For example, sputtered carbon films (carbon films which have been deposited by sputtering) have been commonly used as protective layers. Chemical vapor deposition (CVD) of carbon has also been used to provide the protective layer. For ease of description, a protective layer consisting of carbon shall be referred to herein as a carbon protective layer.

With the recording density of hard disks continuing to increase, it has become necessary to provide carbon protective layers having a reduced thickness as compared to those conventionally used in the past. Greater recording density means less space between the sectors on the hard disk. When the space between sectors is reduced, the distance between the recording head and the magnetic recording layer must also be reduced. Currently available hard disks have a recording density of 1.6 gigabytes per square inch. Because the carbon protective layer is deposited on the magnetic recording layer, the thickness of the carbon protective layer must be reduced in order to minimize the distance between the recording head and the magnetic recording layer. Current commercial embodiments use films of between about 100–150 Å. This is expected to be reduced to 50–100 Å.

FIG. 13 is a schematic plan view of a conventional plasma CVD film deposition chamber. The deposition chamber 6 is equipped with a pumping system 61, a process gas delivery system 62 for introducing a process gas into the film deposition chamber 6, plasma generating means 63 forming a plasma by providing energy to the process gas which has been introduced by the process gas delivery system, and a transfer system (not shown) used to transfer a substrate 9 inside the deposition chamber 6.

The process gas delivery system 62 is designed to introduce an organic compound gas such as methane ($CH_4$) into the interior region of the deposition chamber 6. The plasma generating means 63 is designed to form a plasma by providing high frequency rf energy to the process gas, and is comprised of a high frequency power source 633 for supplying high frequency electrical power by way of a matching box 632 to a high frequency electrode 631. When plasma of a gas such as methane is formed, the gas in the plasma decomposes resulting in a thin film of carbon being deposited on the surface of the substrate 9. The deposited layer of carbon is then polished to a prescribed thickness.

Carbon films may be broadly divided into amorphous carbon films and crystallized carbon films. Crystallized carbon films are generally made of graphite, but some have a lattice structure similar to a diamond and are referred to as diamond-like carbon (DLC) films. In the manufacture of carbon films by plasma enhanced CVD using a hydrocarbon compound gas such as methane, when energy is provided by the collision of negative ions, a reduction in C—H bonds and C covalent bonds in the plasma occur which results in more C single bonds thereby resulting in a film having a diamond lattice structure.

A drawback associated with conventional film deposition apparatuses used to form carbon protective layers is that during the deposition process the carbon, used to provide the protective layer on the hard disk, is also deposited on the exposed surfaces inside the deposition chamber. As the carbon film buildup increases within the deposition chamber, the film separates as a result of internal stresses, gravity, etc., resulting in undesirable carbon particles being released inside the deposition chamber. These undesirable particles adhere to the surface of the substrates inside the chamber, forming protrusions on the surface of the protective layer, resulting in local irregularities in film thickness which can cause head crashes or signal errors.

FIG. 14 is an exploded, cross-sectional view of the surface of an information recording disk and a device used to detect defects on the surface of the disk. When the carbon protective layer is deposited with the particles adhering on the substrate surface, protrusions 902 are formed as shown. The particles and the protrusions resulting therefrom can have a diameter in the range of between about 0.1 to 0.5 microns.

To detect the presence of such protrusions, a glide height test is performed after the carbon protective layer is deposited on the magnetic recording layer. The glide height test is a test in which a tip 904 of a detector 903, as shown in the dashed outline in FIG. 14, is used to scan the carbon protective layer 901 while being held a predetermined distance above the surface of the protective layer. In present applications, the distance d is set at 1 micro-inch. When the tip 904 contacts a protrusion 902 a short circuit is generated within a detection circuit (not shown) which provides an indication that the hard disk contains a protrusions of sufficient size to make the hard disk defective.

In conventional film deposition apparatuses, a considerable amount of carbon particles may be produced by the separation of the carbon film deposited on the exposed surfaces in the processing chamber which, in turn, cause many carbon particles to contaminate the surfaces of substrates. It is difficult to remove all the protrusions and smooth the substrate in subsequent processing steps. Furthermore, when large protrusions are deposited by the accumulation of carbon particles, attempts to remove the protrusions can lead to problems such as scratches or pitting on the surface of the substrate. Such scratches or pitting might pass the glide height test, but often are considered defects in subsequent certifying tests (i.e. recording and playback tests). A drawback associated with conventional film deposition apparatuses has thus been the inability to reduce the incidence of product defects.

SUMMARY OF THE INVENTION

The aforementioned and related drawbacks associated with conventional film deposition apparatuses are substantially reduced or eliminated by the thin film deposition apparatus of the present invention. The thin film deposition apparatus of the present invention includes an undercoat deposition chamber which deposits a layer of chromium to a substrate to be treated, a magnetic layer deposition chamber which provides a layer of CoCrTa, or other suitable material, on the previously deposited chromium layer which acts as a magnetic recording layer, a protective layer deposition chamber which provides a layer of carbon over the previously deposited magnetic recording layer to act as a protection layer and a holding chamber which temporarily holds the resulting information recording disk upon completion of the processing steps. The protective layer deposition chamber includes a system which removes excess carbon particle buildup from within the chamber by selectively introducing heated plasma and oxygen gas into the interior region of the chamber. The heated plasma and oxygen interact with excess carbon particles, resulting in the formation of a gas which is expelled from the interior of the protective layer deposition chamber by a pumping system. The holding chamber is used to maintain the newly formed information recording disks while the excess carbon particles, generated by the protective layer deposition process, are removed from the interior region of the deposition chamber in order to prevent the information recording disk from being damaged.

By providing a mechanism to remove excess carbon particle buildup from the protective layer deposition chamber, irregularities on the surface of the information recording disks are eliminated or substantially reduced. The removal of information recording disk irregularities results in enhanced signal accuracy and recording disk integrity.

An advantage of the present invention is that it provides a protective film layer having a planar surface and enhanced protective characteristics.

Another advantage of the present invention is that it effectively prevents unwanted carbon particle buildup from within the deposition processing chambers.

Yet another advantage of the present invention is that is increases information recording disk fabrication yields.

A feature of the present invention is that it uses plasma cleaning to effectively remove excess carbon particle buildup from within film deposition chambers.

Another feature of the present invention is that it provides the ability to remove treated substrates from respective deposition chambers before plasma cleaning of the respective chambers begins.

BRIEF DESCRIPTION OF THE DRAWINGS

The aforementioned and related advantages and features of the present invention will become apparent from the following detailed description of the invention, taken in conjunction with the following drawings, where like reference numerals represent like elements, in which.

DETAILED DESCRIPTION OF THE INVENTION

Figure 1:
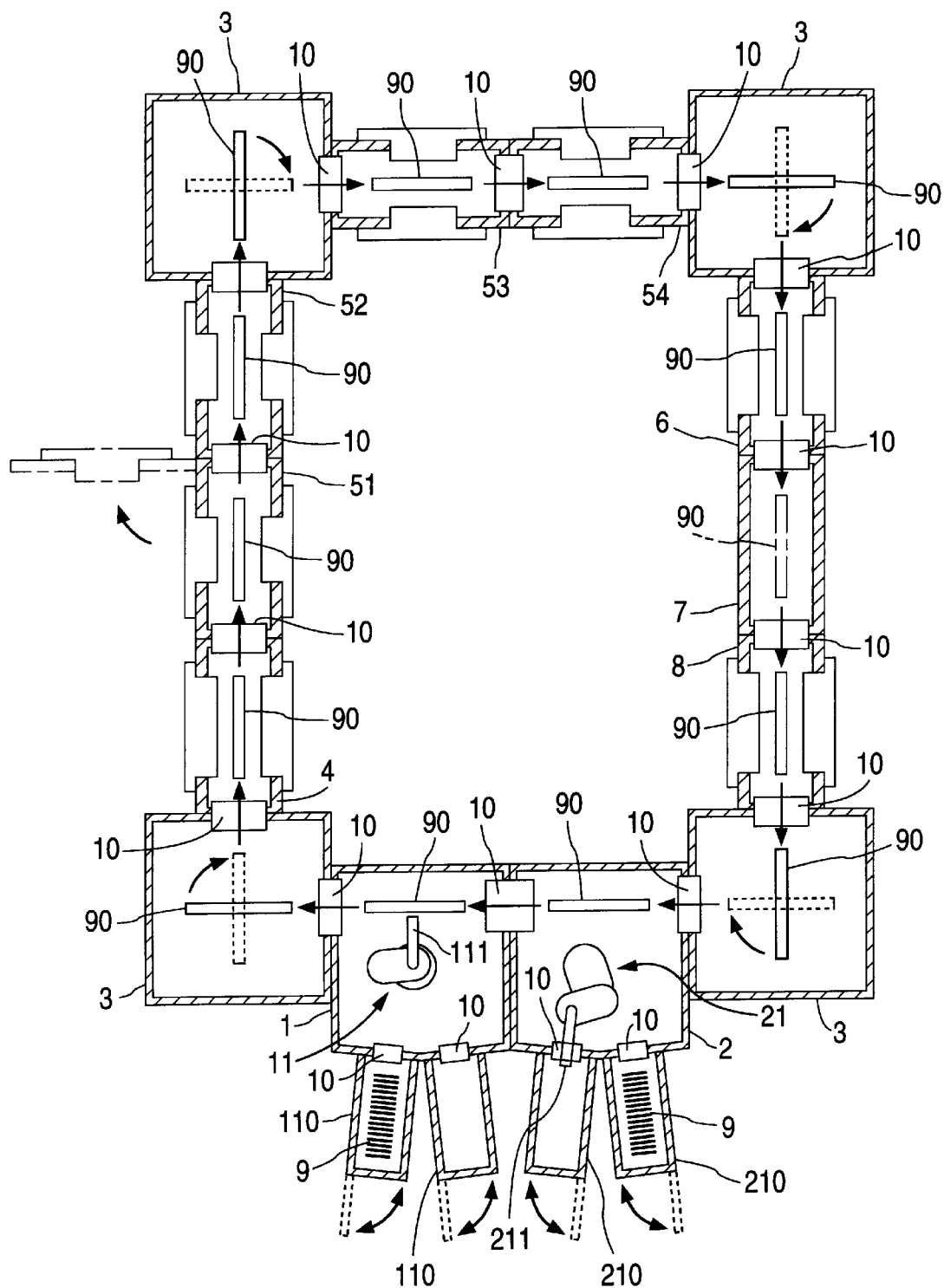
FIG. 1 is a schematic plan view of the thin film deposition apparatus according to a first embodiment of the present invention.

The thin film deposition apparatus of the present invention will now be described with reference to FIGS. 1 through 12. FIG. 1 is a schematic plan view of a thin film deposition apparatus according to a first embodiment of the present invention. As shown in FIG. 1, the thin film deposition apparatus includes a series of substrates 9 contained within a cassette 110. The substrates 9 are mounted inside a loading chamber 1 by the arm 111 of a mounting robot 11. The mounting robot 11 sequentially places the substrates 9 onto a plurality of carriages 90 which sequentially translate the substrates through the thin film deposition apparatus. A directional control mechanism (not shown) is employed to control the direction of travel of the carriage 90. Directional rotation chambers 3 are used to rotate the direction of substrate travel ninety degrees (90°). A more complete description of the directional control mechanism is provided in Japanese Laid-Open Patent Application 8-274142 which is assigned to the same assignee as the present invention, and is incorporated fully herein.

After an individual substrate 9 has been loaded onto the carriage 90 by the mounting robot 11, the substrate is transferred through gate valve 10 into a process chamber 4 where the substrate is heated to a prescribed temperature. In one embodiment, the substrate is heated to a temperature of about 230° C. After being heated, the substrate 9 is transferred through another gate valve 10 into a first film deposition chamber 51 where a chromium (Cr) undercoat layer is deposited on the substrate 9.

After the undercoat layer had been deposited, the substrate is transferred to a first magnetic film deposition chamber 52 where a layer of magnetic material, such as CoCrTa, is deposited on the undercoat layer to form the recording layer of the information recording disk. Although described above as a single processing step, the recording layer can be deposited in two or more processing steps according to the present invention. As further illustrated in FIG. 1, in the two layer deposition process, after the CoCrTa layer is deposited on the undercoat layer in the first magnetic film deposition chamber 52, the substrate 9 is transferred to a second undercoat film deposition chamber 53 where a second undercoat layer of Cr is deposited on the substrate, followed by a second layer of CoCrTa being deposited on the second undercoat layer of Cr in the second magnetic film deposition chamber 54. Although the magnetic recording layer has been described as being CoCrTa, other materials such as CoCrPt and CoCrPtTa may also be used as magnetic recording layers. After the completion of either the single layer process or the multi-layer process described above, the substrate is then transferred to protective film deposition chamber 6 where a protective layer of carbon is deposited on the magnetic recording layer to complete the fabrication of the information recording disk.

After the final processing steps have been completed, the resulting information recording disk is then transferred to an unloading chamber 2 where a recovery robot 21 removes the finished information recording disk from the carriage 90 and places it into a cassette 210 for removal from the thin film deposition apparatus.

Figure 2:
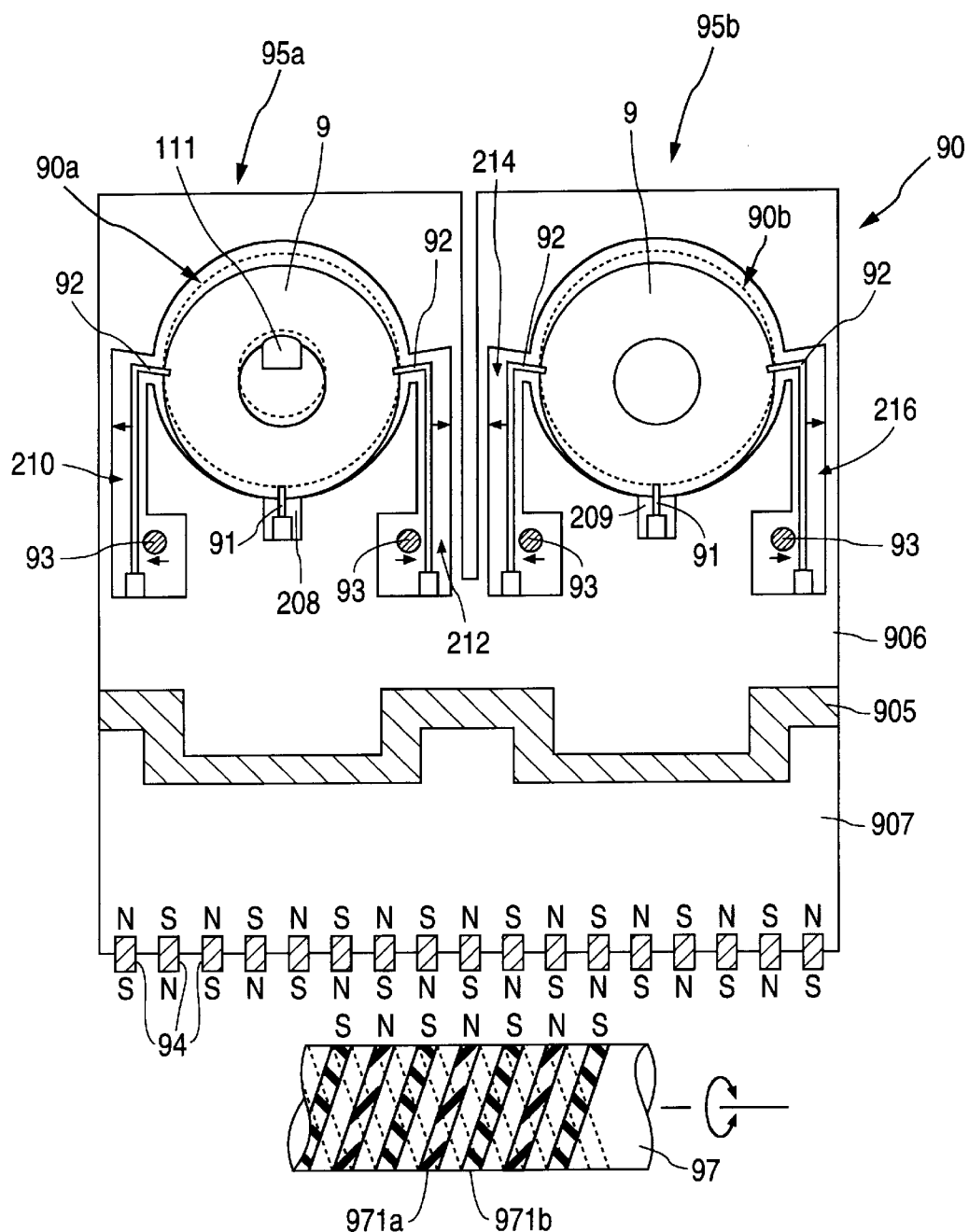
FIG. 2 is a schematic cross-sectional side view of the carriage upon which the substrate manufactured by the film deposition apparatus of the present invention is placed.

The system used to transfer the substrates through the thin film deposition apparatus, and the structure and operation of each of the processing chambers will now be described. FIG. 2 is a schematic cross-sectional side view of the substrate carriage 90 of the present invention. As shown in FIG. 2, the substrate carriage 90 is comprised of a substantially rectangular-shaped member having an upper block portion 906 and a lower block portion 907. An insulator block portion 905, made from a suitable material is interposed between the upper block portion and the lower block portion. The upper block portion 906 includes a pair of plate shaped members (95a, 95b) each having a generally circular carriage opening (90a, 90b) formed therein. The two carriage openings have a diameter that is larger than the diameter of the substrate 9. A narrow channel opening is present on the bottom (208, 209) of carriage openings 90a and 90b, respectively, for maintaining a holding pawl 91 (hereinafter referred to as bottom edge holding pawl). Channels are present along the left (210, 214) and right portions (212, 216) of the respective carriage openings for maintaining side holding pawls 92 therein. The tips of the bottom edge holding pawls 91 are located on a perpendicular line passing through the center of the mounted substrate in order to hold the substrate 9 along the center of its bottom edge.

The side holding pawls 92 on the left (210, 214) and right (212, 216) edges (hereinafter, side edge holding pawls) of the members (95a, 95b) are constructed in such a fashion that the side edge holding pawls 92 contact the side edges of the substrate 9. The movement of the side edge holding pawls 92 are controlled by plate springs which are opened and closed by opening/closing rods 93. When a substrate 9 is placed on a carriage 90, the tip of arm 111 is inserted into the substrate opening to hold the substrate 9 and situate the substrate relative to the carriage opening 90a as shown in dashed outline. At this point, the opening/closing rods 93 are in the open position thereby causing the side edge holding pawls 92 to be in a position away from the substrate. The arm 111 then moves the substrate 9 onto the bottom edge holding pawl 91. Next, the opening/closing rods 93 are placed in the closed position, thereby causing the side edge holding pawls 92 to contact the sides of the substrate 9 and maintain the position of the substrate 9 within the carriage opening 90a.

When the substrate 9 is removed from the carriage 90, the operation of the carriage elements are exactly the reverse of those described above. As the side edge holding pawls 92 are opened by the movement of the opening/closing rods 93, the arm 111 for holding the substrate 9 ascend slightly inside the carriage opening 90a. The arm 111 then moves horizontally to retract the substrate 9 from the carriage 90.

The substrate 9 is transferred to/from the carriage 90 by being moved horizontally. As shown in FIG. 2, several small magnets (hereinafter, referred to as carrier side magnets) 94 are situated along the bottom edge of the carriage 90 and are arranged by alternating the opposite poles of the magnets. A magnetic coupling roller 97 is arranged along the bottom of the carriage 90, with a housing 96 (FIG. 3) interposed between the carrier side magnets 94 and the coupling roller 97. The magnetic coupling roller 97 is made from rod-shaped members having spirally extending magnets (hereinafter, referred to as roller side magnets) 971 formed on the outer circumference thereof. The roller side magnets 971 are comprised of a pair of magnets (971a, 971b) having opposing polarities. The magnetic coupling roller 97 is disposed in such a way that the roller side magnets 971a, 971b face the carrier side magnets 94 with the housing 96 being interposed therebetween. The housing 96 is formed from a highly permeable material which allows the carrier side magnets 94 and the roller side magnets 971 to be magnetically coupled through the diaphragm 96. Those skilled in the art will appreciate that other mechanisms for translating the carriage could also be employed.

Figure 3:
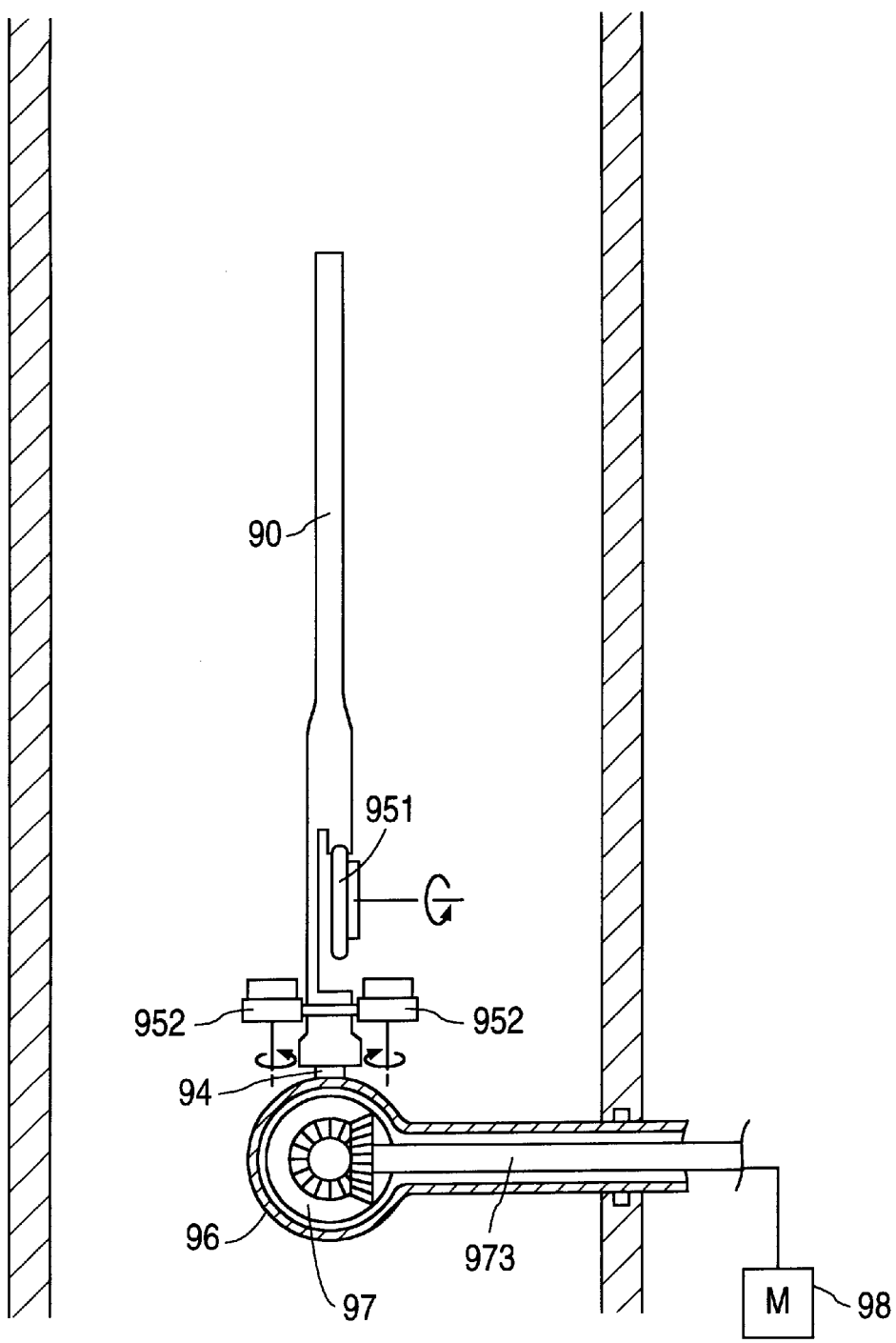
FIG. 3 is a schematic side view of a portion of the structure for moving the carriage according to the present invention.
Figure 4:
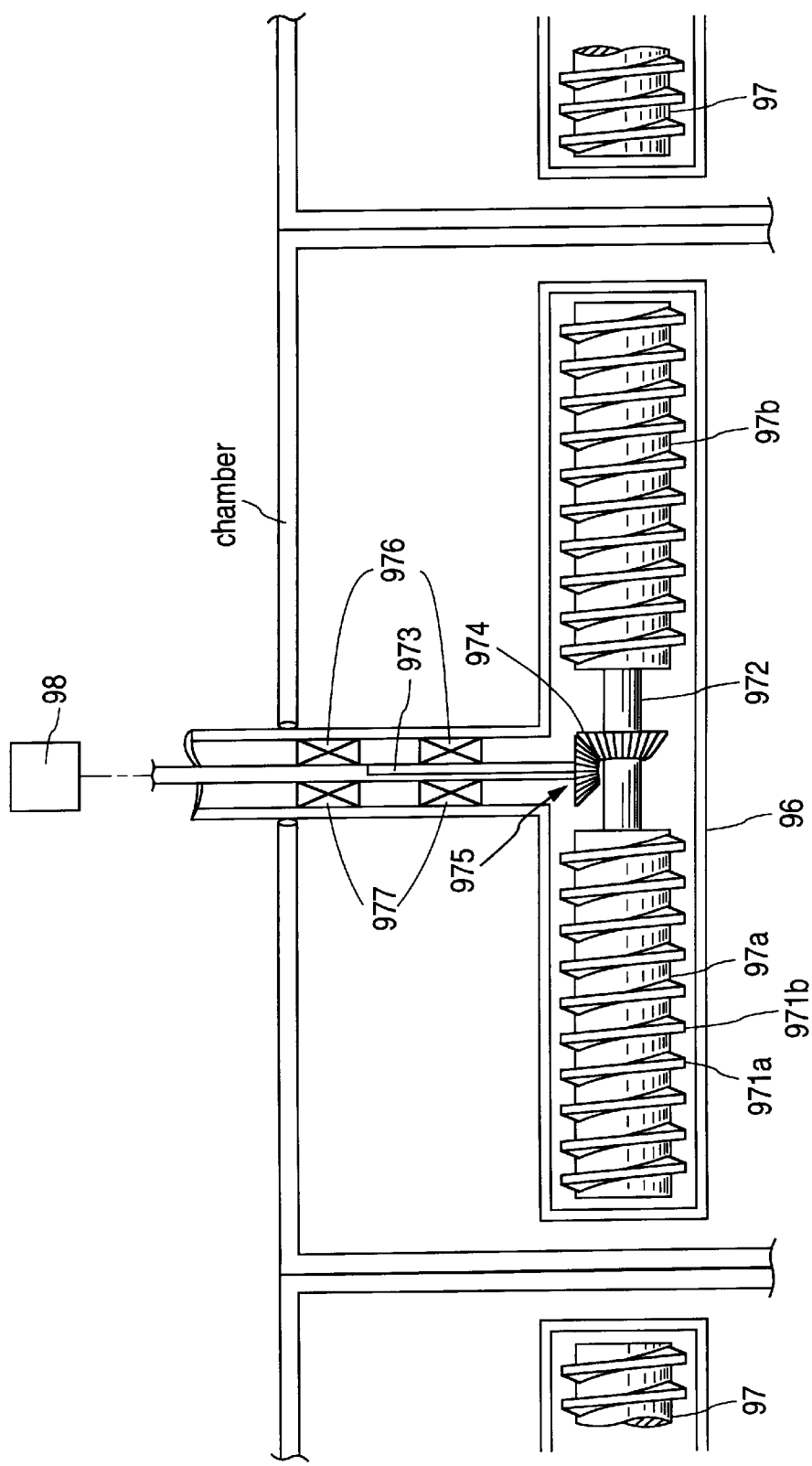
FIG. 4 is a schematic side view of a portion of the structure for moving the carriage according to the present invention.

The structure of an individual portion of the directional control mechanism will now be described with reference to FIGS. 3 and 4. FIG. 3 is a schematic side view of a portion of the mechanism for moving the carriage 90, and FIG. 4 is a schematic side view of a portion of the mechanism for moving the carriage 90. As shown in FIG. 3, the carriage 90 is placed on a main roller 951 that rotates about a horizontal axis. Auxiliary rollers 952 rotate about an axis perpendicular to the main roller 951, and are in contact with the bottom of the carriage 90. Auxiliary rollers 952 press on either side of the bottom portion of the carriage 90 to prevent the carriage from rotating.

As shown in greater detail in FIGS. 3 and 4, housing 96 separates the magnetic coupling roller 97 and the carrier side magnets 94. Two magnetic coupling worm gears (97a, 97b) are mounted on rod 972 in the housing 96. A gear 974 is provided on the rod 972. A drive rod 973 having a gear 975, which engages gear 974, is also present within the housing 96. The drive rod 973 is perpendicular to rod 972, and is connected to a drive motor 98. Bearings (916, 977) allow rotation of drive rod 973. When the drive motor 98 is actuated, the drive rod 973 rotates causing the gears 974 and 975 to rotate. This rotation causes magnetic coupling roller 97, to rotate. When the magnetic coupling roller 97 rotates, the roller side magnets (971a, 971b) rotate. Rotation of the roller side magnets 971 is equivalent to a plurality of small magnets with alternating magnetic poles in series, moving in the horizontal direction. As such, the carriage side magnets 94 coupled to the roller side magnets (971a, 971b) move in a linear fashion along with the rotation of the roller side magnets (971a, 971b), resulting in the linear movement of the carriage 90.

Figure 5:
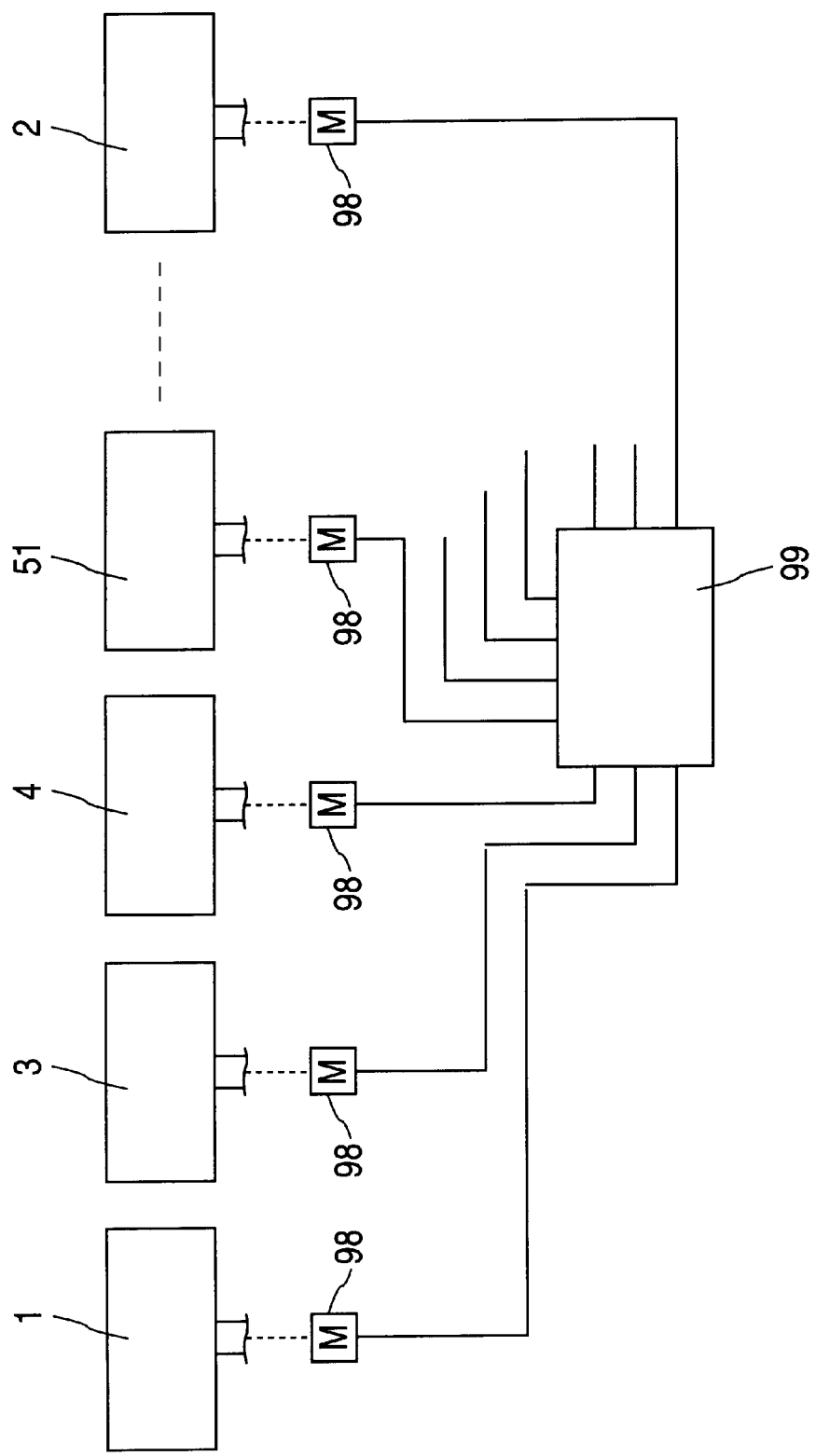
FIG. 5 is a schematic diagram of the control system for transferring the thin film deposition apparatus of the present invention.

FIG. 5 is a schematic diagram of the control system for transferring disks through the thin film deposition apparatus of the present invention. Individual units of the aforementioned magnetic coupling roller 97, connecting rod 972, drive rod 973, drive motor 98, and associated parts are located in each of the chambers 1, 2, 3, 4, 51, 52, 53, 54, 6, 7 and 8. Controller 99 which controls the entire system for translating disks through the system sends signals to the respective drive motors 98 located in each of the aforementioned chambers, allowing each drive motor 98 and the corresponding carriage 90 to be independently controlled.

The specific structure of the processing chambers, used in the thin film deposition apparatus of the present invention, will now be described. First, the substrates 9 are heated to a temperature of between about 100–130° C. in preheat chamber 4 (FIG. 1). This causes degassing of the substrates, i.e., the release of any occluded gas in the substrate. When a film is deposited without degassing the substrate, gas bubbles may develop in the film during subsequent deposition, causing the film surface to become rough as a result of the bubbling. The preheating chamber 4 is equipped with a gas feeding system (not shown) which introduces an inert gas, such as nitrogen, into the interior of the preheating chamber, and heating means for heating the substrate 9 being transferred. Any suitable heating mechanism, such as an infrared lamp, may be used as the heating means. It is most practical to control the operation of the heating means in such a way as to allow the drop in thermal capacity, which occurs when the preheating chamber 4 is empty, to be corrected. Heating conditions which avoid changes in the temperature inside the preheating chamber 4 when the preheating chamber is empty should be experimentally determined beforehand and maintained. For example, in one embodiment, when the heating means is an infrared lamp, the temperature within the preheating chamber is constant when the heating means is operated at about 80% power. When new carriages are transferred into the preheating chamber, the heating means may then be returned to full power.

Figure 6:
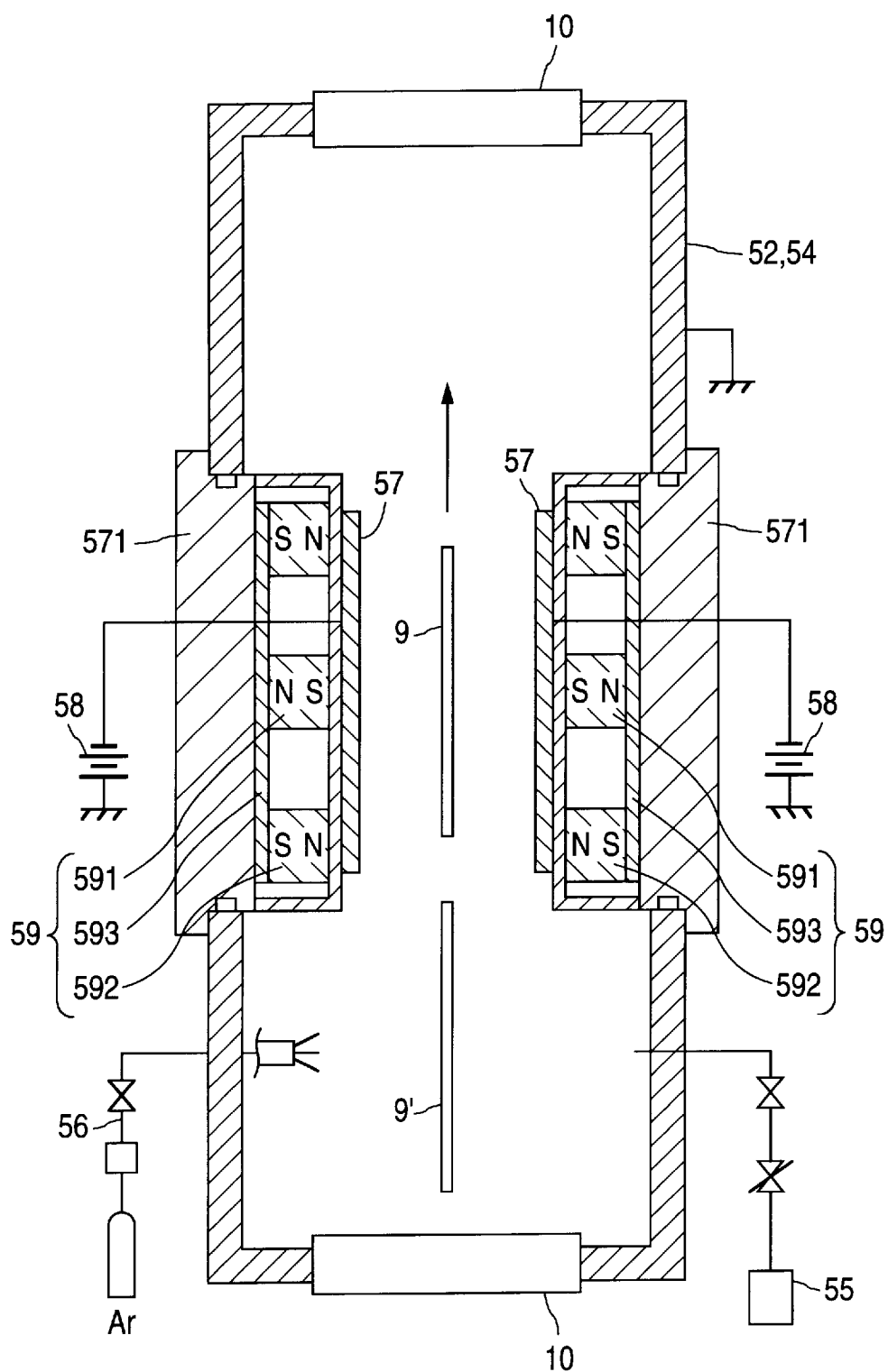
FIG. 6 is a schematic cross-sectional plan view of a magnetic deposition chamber of the present invention.

Undercoat layer deposition chambers 51 and 53 and magnetic layer deposition chambers 52 and 54 will now be described. Undercoat layer deposition chambers 51 and 53 and the magnetic layer deposition chambers 52 and 54, respectively, deposit undercoat layers or magnetic layers by performing a sputtering process. The structure of the undercoat layer and magnetic layer depositing chambers are very similar, the primary difference being the target materials. Thus, for ease of description, a magnetic layer deposition chamber will be described and shall apply equally to the undercoat layer deposition chamber. FIG. 6 is a schematic cross-sectional plan view of the magnetic layer deposition chamber 52. Magnetic layer deposition chamber 52 comprises a pumping system 55 to evacuate the interior of the chamber, a gas delivery system 56 for introducing plasma gas into the interior of the chamber, a sputter target 57 which is exposed to the plasma formed in the interior of the chamber, a sputtering power supply 58 for applying a discharge voltage to the target 57 and a magnet system 59 located behind target 57. The pumping system 55 is equipped with one or more vacuum pumps, such as a roughing pump and a cryopump, capable of reducing the pressure within the interior of the magnetic layer deposition chamber 52 to about $10^{-9}$ torr. The gas delivery system 56 is designed to allow a prescribed amount of a gas, such as argon, to be introduced as the plasma gas. The sputtering power supply 58 is designed to generate a voltage in the range between about −300 to −500 V to be applied to the target 57 in order to sustain a plasma. The magnet system 59 is used to produce a magnetron discharge and consists of a center magnet 591, a peripheral magnet 592 in the form of a ring around the center magnet 591 and a plate-shaped yoke 593, linking the center magnet 591 and the peripheral magnet 592. The target 57 is fixed by means of an insulating block 571 to the magnetic layer deposition chamber 52. The magnetic layer deposition chamber 52 is electrically grounded.

After a suitable amount of the plasma gas is introduced by the gas delivery system 56, the interior of the magnetic layer deposition chamber 52 is maintained at a prescribed pressure by the pumping system 55, and the sputtering power supply 58 is actuated. As a result, a plasma is formed and confined by the magnetic field to a region adjacent to the surface of target 57. As is well known, this causes sputtering from the target 57, and the material released from the target 57 is deposited on substrate 9 resulting in the formation of the prescribed magnetic layer on the surface of the substrate 9. In one embodiment of the present invention, the target 57 consists of CoCrTa, which results in a CoCrTa layer being deposited on the surface of the substrate 9. As may be seen in FIG. 6, targets 57, magnet systems 59 and sputtering power supplies 58 are provided on either side of the substrate in order to form magnetic layers on both sides of the substrate 9. Also shown in FIG. 6, the targets 57 are somewhat larger than the substrate 9. In one embodiment, carriage 90 moves inside the magnetic layer deposition chamber 52 so that two substrates 9 are sequentially located in front of the targets 57. That is, the forward substrate 9 is first located in front of the targets 57, where a film is deposited thereon. The forward substrate is then advanced a prescribed distance, allowing the rear substrate 9, contained on the carriage 90, to be positioned in front of the targets 57 so that a magnetic film is deposited on the rear substrate.

Figure 7:
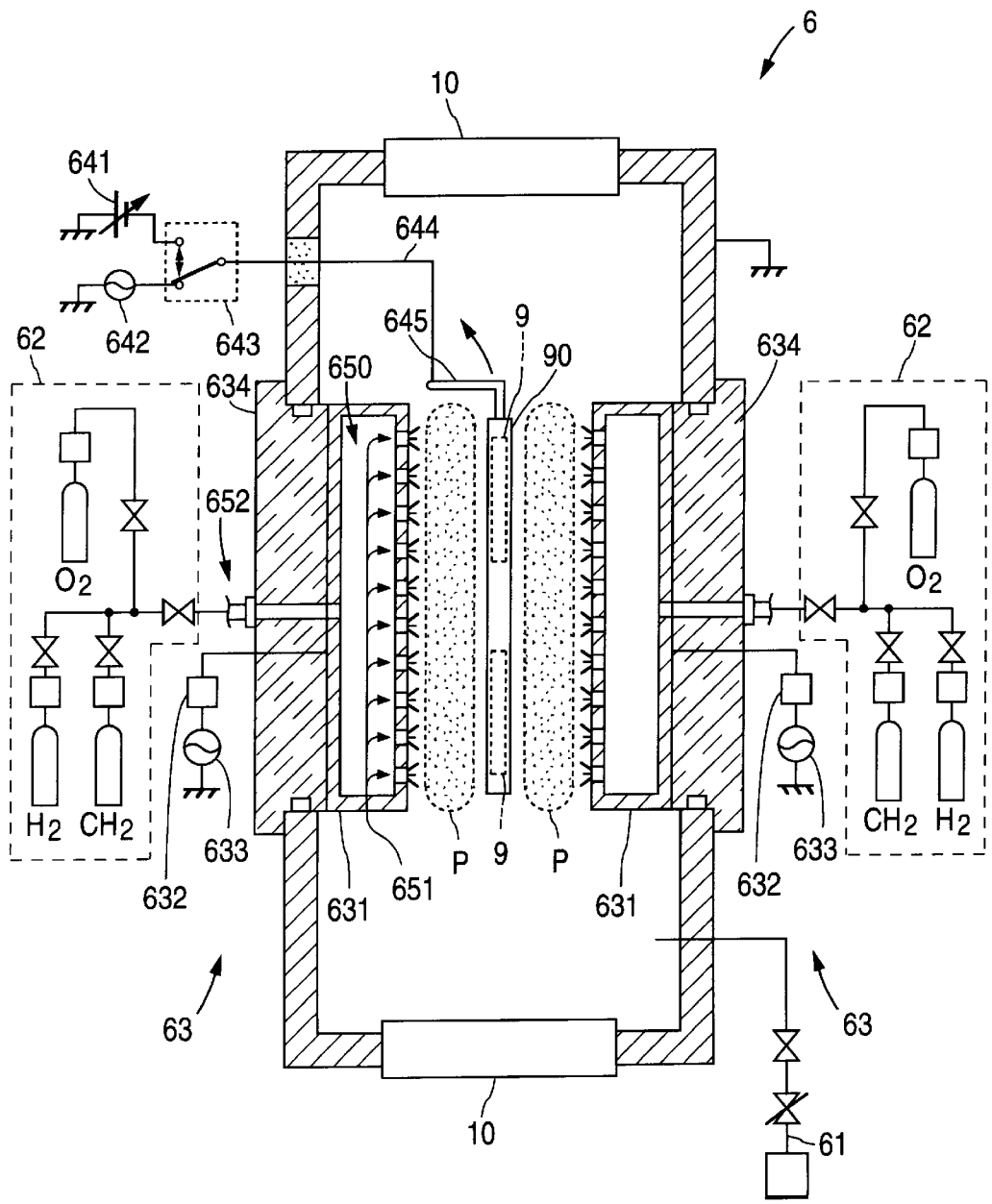
FIG. 7 is a schematic plan view of the protective layer deposition chamber of the present invention.

FIG. 7 is a schematic plan view of the protective layer deposition chamber 6 of the present invention. The deposition chamber of FIG. 7 employs plasma-enhanced chemical vapor deposition (CVD) to deposit a carbon film. The protective layer deposition chamber 6 comprises a pumping system 61 for evacuating the interior of chamber 6, and a gas delivery system 62 for introducing a processing gas into the interior of the chamber. A plasma (P) is formed to provide energy to the processing gas introduced by the gas delivery system. The pumping system 61 is equipped with a vacuum pumping system, such as a turbo-molecular pump, to establish and maintain a pressure of about $10^{-7}$ torr within the chamber. The gas delivery system 62 is designed to introduce a processing gas, such as methane and hydrogen, at a prescribed flow rate. Alternate processing gases such as $C_2H_4$ or $C_2H_6$ may also be used.

Plasma is formed within chamber 6 by applying a high frequency rf energy to the processing gas that has been previously introduced. Specifically, the plasma is generated by a high frequency electrode 631 located within the protective film depositing chamber 6, and a high frequency power source 633 for supplying power through a matching network 632 to the high frequency electrode 631. High frequency electrode 631 has a hollow interior 650, with a plurality of apertures 651 in the front surface thereof. Gas delivery system 62 is connected to electrode 631 at node 652 such that the processing gas entering the hollow interior 650 of electrode 631 will be uniformly discharged through the apertures 651 at a prescribed rate. Electrode 631 is mounted on insulating block 634 to the protective film deposition chamber 6. The protective film deposition chamber 6 is electrically grounded.

High frequency power source 633 supplies electrical power at a frequency of about 13.56 MHz, resulting in an output of 500 W to electrode 631. The resulting high frequency electric field results in a high frequency plasma discharge being produced in the processing gas. In the plasma, the decomposition of the methane results in the deposition of carbon on the surface of the substrate 9, forming a carbon protective film on the substrate. According to the first embodiment of the present invention, a bias voltage is applied to the substrate 9 during the deposition of the carbon film. The bias voltage causes ion collisions with the substrate by extracting ions from the plasma.

As shown in greater detail in FIG. 7, a negative DC power supply 641 and a second high frequency power source 642 are provided outside the protective film deposition chamber 6, and are coupled to deposition chamber 6 by a switch 643. Wire 644 passes through the wall and into deposition chamber 6. A resilient contact 645 is provided at the tip of the wire 644 and contact 645 is coupled to the upper block 906 (FIG. 2) of the carriage 90 to provide that the negative DC voltage or high frequency voltage is applied through the carriage 90 to the substrate 9. When high frequency voltage is applied, suitable capacitance is provided between the second high frequency power source 642 and the substrate 9, and high frequency rf energy is applied by means of the capacitance to the substrate 9. As a result of the interaction between the rf energy that had been applied to the plasma, a negative self bias voltage is produced at the substrate 9. The negative DC voltage or negative self bias voltage extracts positive ions from the plasma to produce collisions with the substrate 9. As specific examples of the negative DC power source 641 and the second high frequency power source 642, an output of about −150 V may be used as the negative DC power source 641, while an output of about 13.56 MHz 50 W may be used as the high frequency power source 642.

The operating parameters used in one embodiment of the protective film deposition chamber 6 are outlined in Table 1 below.

TABLE 1

$CH_4$ gas: 20 cc/min
Hydrogen gas: 100 cc/min
Pressure inside protective film deposition chamber: 2 Pa
High frequency power: 13.56 MHZ 400 W (x2)
Film depositing speed: 10–15 Å/sec
Film depositing speed: 3.5–5 sec High frequency electrode 631 is large enough to provide plasma adjacent to two substrates 9, thereby allowing deposition of a carbon film simultaneously on the two substrates contained within the carriage 90. High frequency electrodes 631, and associated structures are provided on both sides of the two substrates 9, allowing the carbon protective film to be simultaneously deposited on both sides of the two substrates.

A feature provided by the thin film deposition apparatus of the present invention is that deposition chamber 6 is adapted to form oxygen plasma. Gas delivery system 62 of the protective film deposition chamber 6 allows oxygen ($O_2$) gas to be selectively introduced into the chamber. The formation of the oxygen plasma is used to prevent unwanted carbon formation inside the deposition chamber 6. In the deposition chamber of the present invention, the carbon film deposited on the exposed surfaces inside the chamber is removed by the oxygen plasma.

Specifically, when oxygen gas is introduced to form an oxygen plasma, an abundance of oxygen ions are produced in the plasma. Carbon film deposited on the exposed surfaces of the protective film deposition chamber contains hydrogen. That is, the film contains C—C bonds as well as C—H bonds. When such a carbon film comes into contact with oxygen ions, the C—C bonds or C—H bonds are broken down as follows:

$$O_2 \rightarrow 2O^+ (\text{or } 2O^-)$$

$$(C-C) + 4O^+ (\text{or } 4O^-) \rightarrow 2CO_2 (\text{or } 2CO + O_2)$$

$$(C-H) + 2O^+ (\text{or } 2O^-) \rightarrow CO + H_2O$$

The $CO_2$, CO, $O_2$ and $H_2O$ produced by the reactions are all gases, and are evacuated from the interior of the deposition chamber 6 by vacuum pump system 61, thereby allowing the carbon film to be removed from the interior surfaces deposition chamber 6.

The following are exemplary operating conditions for the removal of unwanted carbon from the interior surface of the process chamber.

TABLE 2

Oxygen flow rate: 150 cc/min
Pressure inside chamber: 15 Pa
High frequency power: 13.56 MHz 500 W (x 2)
Pumping system speed: 6,000 L/min When the oxygen cleaning process is performed under the conditions of Table 2, carbon film is removed at a rate of about 600 Å/min.

In accordance with the present invention, substrate 9 is removed from deposition chamber 6 and transferred to holding chamber 7 during the oxygen plasma removal process. In a first embodiment, holding chamber 7 is a vacuum chamber with its own vacuum pumping system 61, but with no processing equipment. Holding chamber 7 is separably maintained at an atmospheric pressure of about $5 \times 10^{-1}$ torr by vacuum pumping system 61. The substrate 9 is transferred to holding chamber 7 during the oxygen cleaning process by the control unit 99 of the transferring system. As described above with respect to FIG. 5, control unit 99 independently controls each of the drive motors 98, allowing independent control. Substrates 9 are thereby removed from deposition chamber 6 during the oxygen cleaning.

The time period from when two processed substrates are unloaded from a carriage 90 in the unloading chamber 2 until two substrates 9 are unloaded from a subsequent carriage 90 is considered the dwell time. The dwell time is determined by the longest time period required to execute the operations of the various chambers. Generally, the magnetic film deposition in the magnetic film deposition chambers 52 and 54 take the longest amount of time, so that the time required for magnetic film deposition and for transferring the substrates to the next chamber is the dwell time. In other words, the dwell time is the longest process time (PT) plus the transfer time (TT). When the time taken in the move to the next chamber differs depending on the chamber, the one taking the most time is the TT, and the dwell time is PT+TT. The carriages 90 are delayed in those chambers where the process or transfer times are shorter than the PT or TT.

Figure 8:
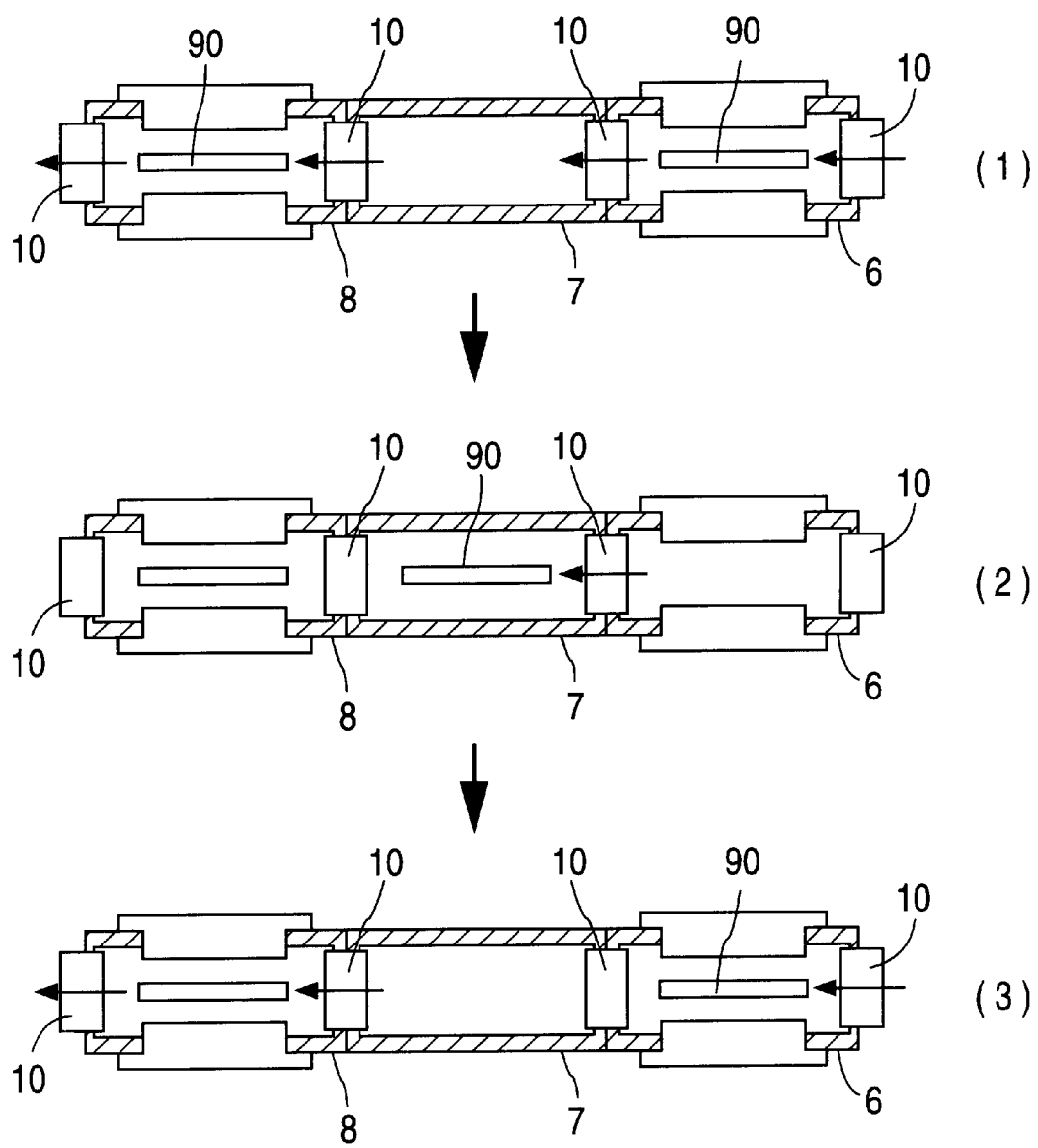
FIGS. 8A–8C depict movement of disks through deposition chambers and holding chambers of the present invention.

During processing, each carriage 90 simultaneously moves to the next processing chamber at the end of the dwell time. In other words, the control unit 99 (FIG. 5) of the transferring system operates in such a way that all drive motors 98 are actuated by the transmission of simultaneous drive signals when the PT time has elapsed and the carriages 90 are all moved simultaneously to the next chamber by the TT time. As previously described, when a carriage 90 reaches the protective film deposition chamber 6, a carbon protective film is deposited on the substrate by plasma CVD. When the deposition of the carbon protective film is completed, the control unit 99 actuates the drive motor 98 of the protective film deposition chamber 6 and the drive motor 98 of holding chamber 7, resulting in the carriage 90 being moved from the protective film deposition chamber 6 to holding chamber 7 as shown in FIG. 8(2). At this time, the control unit 99 does not actuate any drive motor 98 other than the drive motors 98 of the protective layer depositing chamber and the holding chamber, and no carriage 90 other than the carriage 90 moving between the protective layer deposition chamber and the holding chamber is actuated. After the carriage is placed in holding chamber 7, the holding chamber 7 is closed, and the gas delivery system 62 in deposition chamber 6 is switched on. Oxygen gas is thus introduced into deposition chamber 6 allowing oxygen cleaning of the chamber as described above.

Next, the control unit 99 of the transferring system sends drive signals to all the drive motors 98 causing the carriages 90 to move to subsequent chambers. As shown in FIG. 8(3), the next carriage 90 is moved into the protective film deposition chamber 6, and the carriage 90 present within chamber 7 is moved to chamber 8 before being transferred to the unloading chamber 21.

As may be seen from the aforementioned description, the oxygen cleaning process may be carried out after every time a carbon protective film is deposited in deposition chamber 6. In the preferred embodiment, the oxygen cleaning process is carried out after each carbon deposition to prevent the buildup of carbon on the exposed interior surfaces of the deposition chamber 6. No substrate is present within deposition chamber 6 during the oxygen cleaning and no substrates are exposed to the oxygen plasma.

According to the first embodiment of the present invention, there is one holding chamber 7 used in the thin film deposition apparatus. This is related to the processing capacity of the protective film deposition chamber 6. In the present embodiment, the time for the carbon deposition in chamber 6, the time for the carriage 90 to move from chamber 6 to holding chamber 7 and the time for the oxygen cleaning process are added together resulting in the aforementioned PT+TT.

Figure 9:
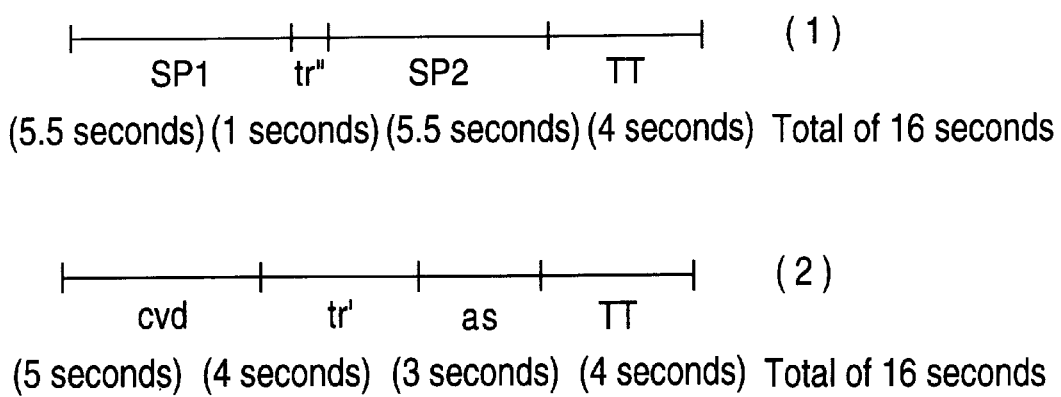
FIG. 9 is a time line representing the operations occurring during the dwell time.

FIG. 9 is a time line representing the operations occurring during the dwell time. FIG. 9(1) depicts an exemplary dwell time in the magnetic layer depositing chambers 52 and 54, while FIG. 9(2) depicts the dwell time in the deposition chamber 6 and holding chamber 7. In an apparatus having a processing capacity of 450 substrates per hour, the dwell time is 16 seconds ((60×60)/(450/2)=16). As shown in FIG. 9(1), the 16 second dwell time used in the magnetic film deposition chambers 52 and 54 is based on a total of 16 seconds, where the time for the deposition of a film (SP1) on the first substrate 9 on a carriage 90 is 5.5 seconds. The time (tr') for the carriage 90 to move in the chambers 52 and 54 in order to deposit a film on the second substrate is one second. The time for the deposition of a film (SP2) on the second substrate is 5.5 seconds, and the time for simultaneously moving all the carriages 90 (TT) is four seconds. In the protective film deposition chamber 6 and the holding chamber 7, as shown in FIG. 9(2), the CVD is five seconds, the tr' is four seconds, the (as) is three seconds and the TT is four seconds, the same as above. Thus, the processing capacity of the protective film deposition chamber 6 is doubled in the present embodiment. The oxygen cleaning step can thus be performed after every carbon film deposition with no drop in productivity.

Figure 10:
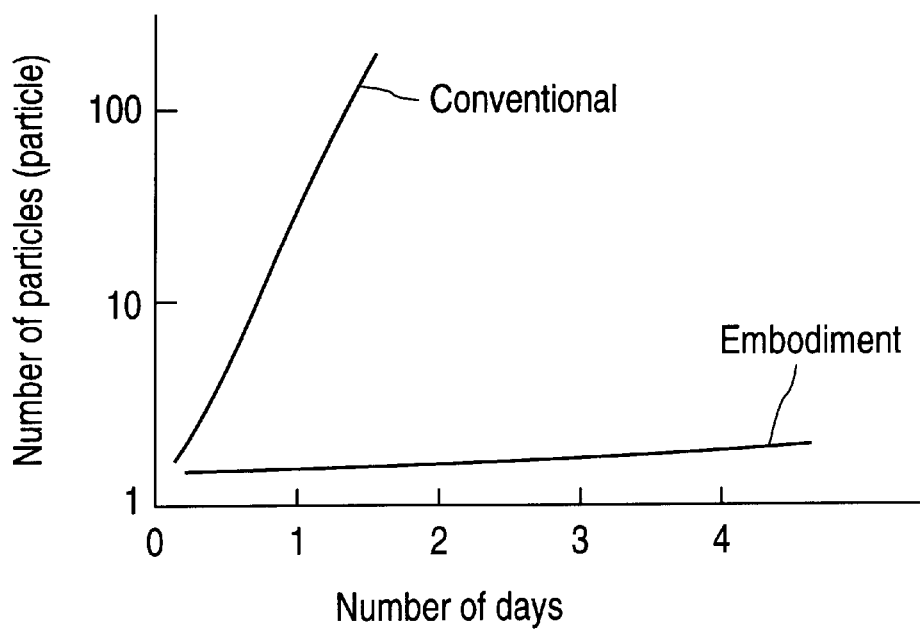
FIG. 10 is a graph illustrating the reduction of carbon particle buildup when using the protective layer deposition chamber of the present invention.
Figure 14:
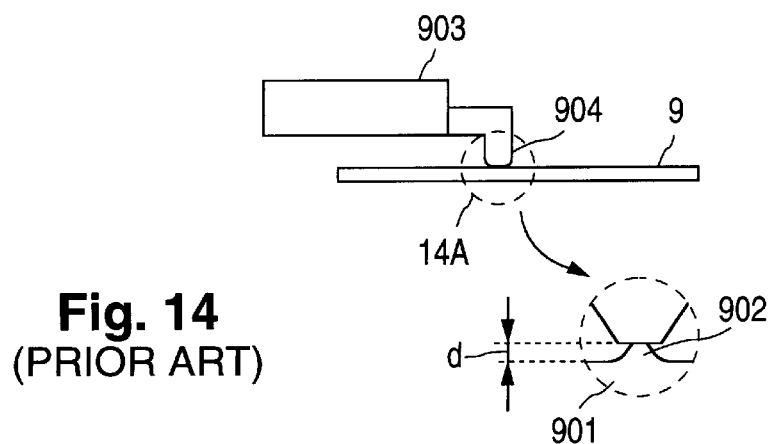
FIG. 14 is an exploded cross-sectional view of the surface of an information recording disk and a device used to detect defects on the surface of the disk.

FIG. 10 is a graph illustrating the reduction of carbon particle buildup when using the protective layer deposition chamber of the present invention. In a test performed by the inventors, the thin film deposition apparatus, as described above, was used to deposit a carbon protective film on a substrate having a diameter of 3.5". The number of particles with a diameter of 1 micron or more remaining on the surface of the substrate was then determined. The vertical axis of FIG. 10 indicates the number of particles, while the horizontal axis indicates the number of days since the protective film deposition chamber was first operated. A carbon film deposition chamber with a processing capacity of about 10,000 substrates per day was used. As seen in FIG. 10, 100 particles were produced in a conventional apparatus after one day of operation, and this number increased rapidly thereafter. When this many particles are produced, a large number of protrusions such as those shown in FIG. 14, are deposited on the substrate, resulting in a high probability of glide height test failures.

In contrast, in the protective layer deposition chamber of the present invention, the number of particles was limited to a few over four days of processing. If there were any protrusions caused by this number of particles, they could be completely removed by a tape burnishing process before the glide height test is administered, which would result in no glide height test failures.

In accordance with another embodiment of the present invention, the holding chamber 7 may be located before the protective film deposition chamber 6. In such a case, after the completion of the process prior to carbon deposition, a carriage 90 is moved into holding chamber 7 and the deposition chamber 6 is empty. Carbon removal is then performed in deposition chamber 6 and the carriage in holding chamber 7 is then moved to the deposition chamber 6. The protective film is then deposited in the second half of the cycle. After processing is completed at each station, all of the gate valves 10 are open, and all the carriages moved to the next chamber. Carriage 90 is thus again located in the chamber 7 and the deposition chamber 6 is empty. The aforementioned operations are then repeated.

When there are a plurality of protective film deposition chambers, there is a corresponding increase in the number of holding chambers. Each holding chamber 7 may be located either before or after each deposition chamber 6. In another embodiment, holding chamber 7 is separated from deposition chamber 6. In this embodiment, the protective layer deposition chamber can be emptied by simultaneously moving only the carriages located in the chambers between the holding chamber 7 and the deposition chamber 6. When holding chamber 7 is located next to the protective film deposition chamber 6, the structure of the control system is made more simple as there are fewer drive motors that need to be independently driven in order to empty the protective film deposition chambers.

Figure 11:
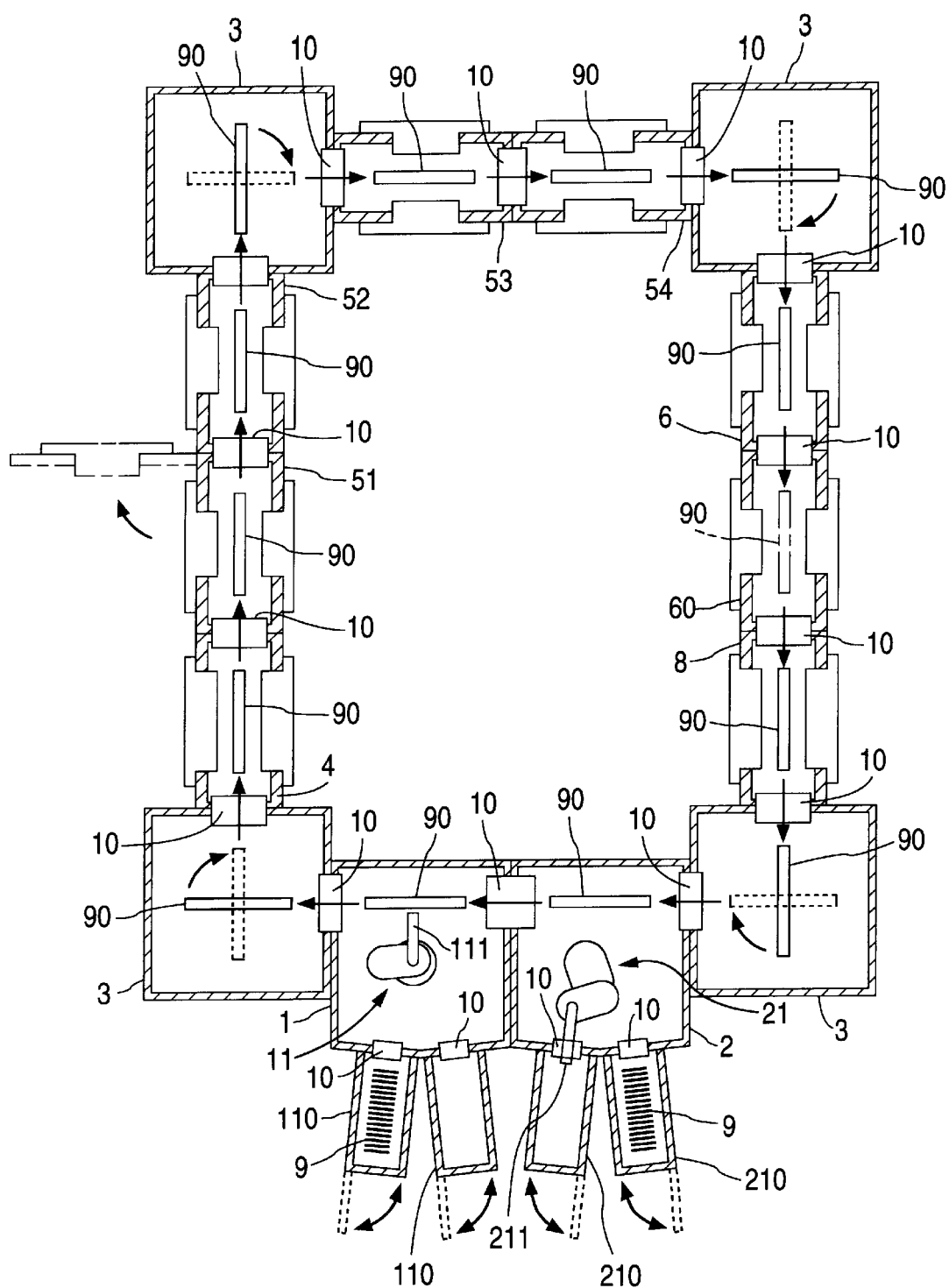
FIG. 11 is a schematic plan view of a film deposition apparatus according to a second embodiment of the present invention.

The thin film deposition apparatus according to a second embodiment of the present invention will now be described with reference to FIG. 11. FIG. 11 is a schematic plan view of a film deposition apparatus according to a second embodiment of the present invention. The second embodiment differs from the first embodiment in that the holding chamber 7 has been replaced with a second protective film deposition chamber 60. The two protective film deposition chambers 6, 60 have the same structure as that depicted in FIG. 7. That is, they are used to deposit protective films by plasma CVD using a composite gas of methane and hydrogen, and a carbon film deposited on the exposed surfaces inside the chambers can be removed by oxygen plasma.

According to the second embodiment of the present invention, when a carriage 90 is transferred to the first deposition chamber 6, the carriage 90 is removed from the second deposition chamber 60, leaving chamber 60 empty. At this time, a mixed gas of methane and hydrogen is introduced into the first deposition chamber 6, to deposit a carbon protective film on the substrate 9. At the same time, oxygen gas is introduced into the empty second deposition chamber 60 thereby removing any carbon inside chamber 60. The protective film deposition treatment and the carbon removal treatment are completed in less than one dwell period. Once the protective layer deposition and the carbon removal treatment have been completed, the gate valve 10 between the first deposition chamber 6 and the second deposition chamber 60 is opened, and the drive motors for chamber 6 and chamber 60 are actuated to move the substrate in the first deposition chamber 6 to the second deposition chamber 60. In the next cycle, all of the gate valves 10 are open and all of the drive motors are operated to move all the carriages to the subsequent chambers. As a result, a subsequent carriage 90 is again positioned in the first deposition chamber 6 and the second deposition chamber 60 is empty. Thus, carbon is deposited in the first and second deposition chambers 6 and 60, respectively. There is no time wasted such as through tracking operations in the holding chambers 7. One unit of dwell time is fully used to execute film deposition and carbon removal. Accordingly, there is no need to double the carbon protective film depositing capacity as is required in the first embodiment, making the second embodiment to the present invention suitable for situations where it would be difficult to double the film-making capacity.

For the operation of the apparatus according to the second embodiment of the present invention, carbon film of half the desired thickness may be deposited in the first deposition chambers 6, and the remaining half of the film may be deposited in the second deposition chamber 60. The carriage 90 moves to chamber 60 before half of one unit of dwell time has elapsed.

Figure 12:
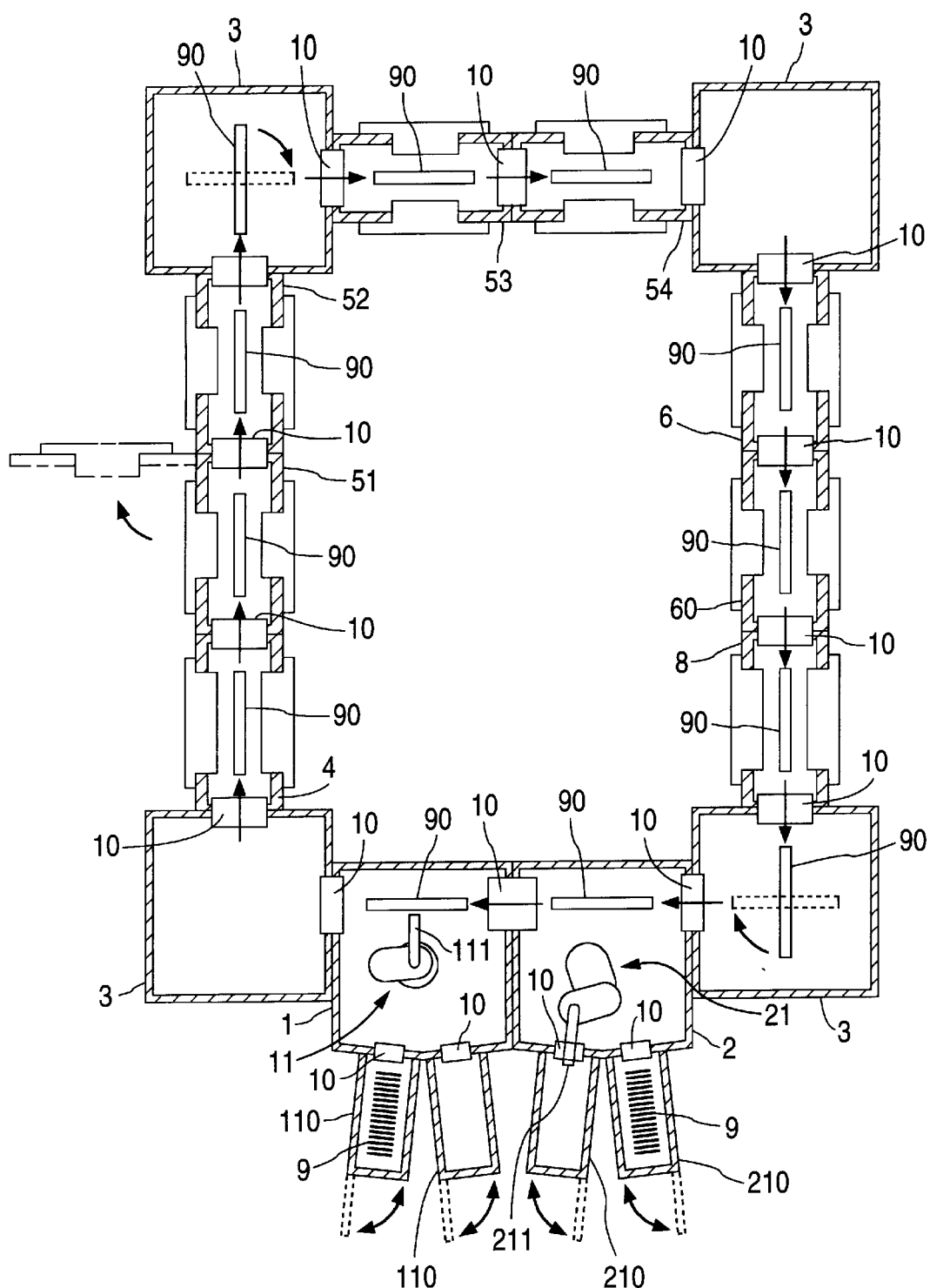
FIG. 12 is a schematic plan view of a film deposition apparatus according to a third embodiment of the present invention.
Figure 13:
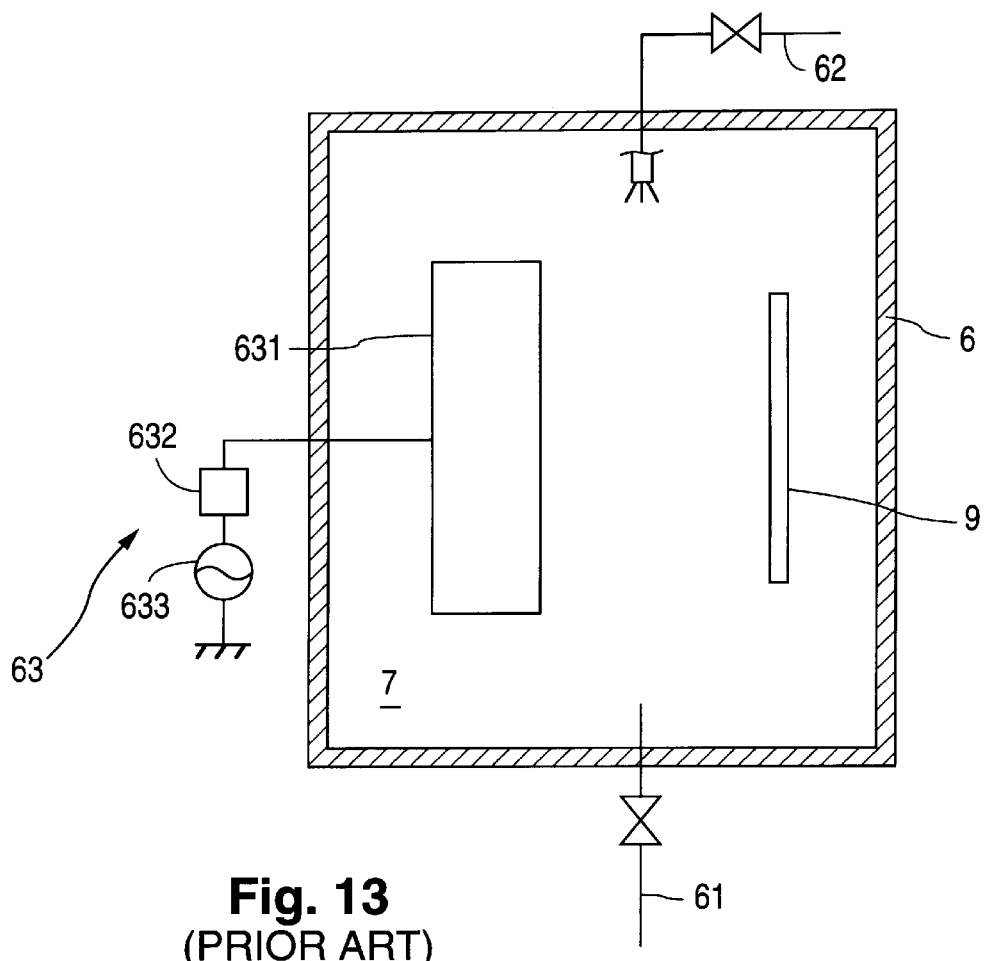
FIG. 13 is a schematic plan view of a conventional plasma CVD film deposition chamber.

FIG. 12 is a schematic plan view of a thin film deposition apparatus according to a third embodiment of the present invention. In this embodiment, there are no carriages 90 present in the directional chambers 3 adjacent to the loading chamber 1 and between the magnetic film deposition chamber 54 and the protective film deposition chamber 6. In the embodiment illustrated in FIG. 12, the drive motors 98 (FIG. 3) are not independently controlled as in the first and second embodiments, but instead are operated simultaneously at the same dwell time.

In operation, after one unit of dwell time has elapsed, all of the carriages 90 move to the next processing chamber in the process flow, resulting in the preheating chamber 4 and the first protective film deposition chamber 6 being empty. As described above, the carbon removal process is performed using oxygen plasma in the empty first protective film deposition chamber 6. While the carbon removal process is being performed on the first protective film deposition chamber 6, a carriage 90 is conveyed into the second protective film deposition chamber 60, where a carbon film is deposited onto the previously deposited layer.

After one unit of dwell time has elapsed, the first undercoat film deposition chamber 51 and the second protective film deposition chamber 60 are empty. Accordingly, the carbon removal process is performed in the second protective film deposition chamber 60 while a carbon protective film is being deposited in the first protective film deposition chamber 6. The protective film deposited in the first and second protective film deposition chambers are deposited in the same manner and have the same thickness as provided in the second embodiment of the present invention. After five units of dwell time have elapsed, one complete process cycle has been completed.

In the third embodiment of the present invention, the carriages are simultaneously controlled, not independently controlled; thus, the structure of the transferring system control unit 99 can be simplified.

The foregoing detailed description of the invention is provided for the purpose of illustration and description and is not intended to be exhaustive or to limit the invention to the precise embodiments disclosed. Many modifications and variations of the disclosed invention are possible in light of the above teaching. For example, thermal CVD can be used to deposit the protective layer instead of plasma CVD. Accordingly, the scope of the present invention is to be defined by the claims appended hereto.

What is claimed is:

1. A coating apparatus for sequentially processing a plurality of magnetic recording disk substrates, comprising:
    at least two processing chambers, each of said processing chambers including means for applying a thin film coating to said substrates and means for cleaning the interior surface of said respective processing chamber;
    means for sequentially translating said substrates to each of said processing chambers; and
    a process controller for controlling the operation of said processing chambers, wherein a first of said processing chambers is applying a thin film coating to a substrate and at the same time, the interior surfaces of a second of said processing chambers are being cleaned by said cleaning means.

2. The coating apparatus of claim 1 wherein said thin film coating is provided by plasma chemical vapor deposition.

3. The coating apparatus of claim 2 wherein said thin film comprises carbon.

4. The coating apparatus of claim 3 wherein said means for cleaning the internal surfaces of the deposition chamber comprises means for creating an oxygen plasma within said processing chamber.

5. The coating apparatus of claim 1 wherein each of said substrates remains in each of said processing chambers for a predetermined dwell time.

6. The coating apparatus of claim 5 further comprising a controller for controlling the movement of substrates.

7. The coating apparatus of claim 6 wherein said controller sequentially causes each substrate to be sequentially advanced from a loading chamber to each of said processing stations in a predetermined order, such that each substrate is advanced in the apparatus at the completion of said dwell time.

8. The coating apparatus of claim 7 wherein said controller and said means for sequentially translating said substrates allows independent control of the movement of the substrates at each said processing chamber.

9. An apparatus for fabricating magnetic recording disks having a plurality of processing chambers comprising:
    a loading station for receiving an plurality of substrates;
    a first deposition chamber for depositing a film of magnetic material onto the surfaces of said substrates, said first deposition chamber including an apparatus for cleaning the interior surfaces thereof;
    a second deposition chamber for depositing a coating of protective material over said film of magnetic material by plasma enhanced chemical vapor deposition, said second deposition chamber including an apparatus for cleaning the interior surfaces thereof and contiguous to said first deposition chamber; and a process controller for controlling the operation of said deposition chambers such that the internal surfaces of said second deposition chamber are cleaned at the same time to the substrates being processed within said first deposition chamber;

a controller for controlling the sequential movement of substrates within said apparatus, such that each said substrate is sequentially moved from one processing station to the next in order after a predetermined dwell time.

10. The apparatus of claim 9, further including a directional rotation chamber and a holding chamber, said directional rotation chamber being interposed between said deposition chambers and said holding chamber, such that the interconnection of said directional rotation chamber, said deposition chambers and said holding chamber forms a closed loop.

11. The apparatus of claim 9 wherein said means for cleaning the internal surfaces of said second deposition chamber comprising means for creating a reactive plasma within said second deposition chamber.

12. The apparatus of claim 11 wherein said protective film is carbon and said reactive plasma comprises an oxygen plasma.

13. The apparatus of claim 9, wherein said controller controls the simultaneous movement of all substrates within said apparatus.

14. A magnetic recording disk substrate processing system, comprising:

at least two contiguous processing chambers, each of said processing chambers including a deposition apparatus for applying a thin film coating to substrates within said chamber and a cleaning apparatus for cleaning the interior surfaces of said processing chamber;

a transport mechanism for sequentially translating substrates to each of said processing chambers; and a process controller for controlling the operation of said chamber such that during a first cycle the deposition apparatus in the first processing chamber is operated to apply a thin film coating to a substrate and the cleaning apparatus in the second of said processing chambers is operated to clean interior surfaces of said second chamber;

during a second cycle said substrate is transferred from said first processing chamber to said second processing chamber by said transport mechanism, such that said first chamber no longer contains a substrate;

during a third cycle said deposition apparatus in said second process chamber is operated to apply a thin film coating to said substrate and the cleaning apparatus in said fist process chamber is operated to clean interior surface of said second chamber.

15. The substrate processing system of claim 14, wherein said system includes a third processing chamber and wherein said controller maintains a substrate in said third chamber during said first, second and third cycles.

16. The substrate processing system of claim 15 wherein said transport mechanism comprises a plurality of substrate-carrying carriages which sequentially move substrates between said processing chambers, the number of substrate carrying carriages being fewer than the number of processing chambers, such that there is not a carriage in a processing chamber undergoing a cleaning operation.

17. The substrate processing system of claim 16 wherein the number of carriages is one less than the number of processing chambers.

18. The substrate processing system of claim 17, wherein said transport mechanism is operative to simultaneously move all carriages carrying a substrate.

19. The substrate processing system of claim 15, wherein said system includes a directional rotation chamber interposed between two processing chambers and said third processing chamber such that said directional rotation chamber.

20. The substrate processing system of claim 15, wherein said system includes a plurality of directional rotation chambers, each of said directional rotation chambers interposed between two processing chambers such that the interconnection of said directional rotation chambers, said processing chambers and said third processing chamber form a closed loop.

* * * * *